(12) United States Patent
Kim et al.

(10) Patent No.: US 11,393,935 B2
(45) Date of Patent: Jul. 19, 2022

(54) OXIDE SEMICONDUCTOR PHOTOTRANSISTOR IMPROVED IN VISIBLE LIGHT ABSORPTION RATE AND MANUFACTURING METHOD THEREOF

(71) Applicants: LG Display Co., Ltd., Seoul (KR); UIF (UNIVERSITY INDUSTRY FOUNDATION), YONSEI UNIVERSITY, Seoul (KR)

(72) Inventors: Hyun Jae Kim, Seoul (KR); Young Jun Tak, Seoul (KR); Jusung Chung, Seoul (KR); Jeong Min Moon, Paju-si (KR); Su Seok Choi, Paju-si (KR); Sungpil Ryu, Paju-si (KR); Jihwan Jung, Paju-si (KR); Kiseok Chang, Paju-si (KR)

(73) Assignees: LG DISPLAY CO., LTD., Seoul (KR); UIF (UNIVERSITY INDUSTRY FOUNDATION) YONSEI UNIVERSITY, Seoul (KR)

( * ) Notice: Subject to any disclaimer, the term of this patent is extended or adjusted under 35 U.S.C. 154(b) by 70 days.

(21) Appl. No.: 16/765,856

(22) PCT Filed: Jun. 14, 2018

(86) PCT No.: PCT/KR2018/006727
§ 371 (c)(1),
(2) Date: May 20, 2020

(87) PCT Pub. No.: WO2019/098477
PCT Pub. Date: May 23, 2019

(65) Prior Publication Data
US 2020/0365743 A1     Nov. 19, 2020

(30) Foreign Application Priority Data
Nov. 20, 2017 (KR) .......................... 10-2017-0154996

(51) Int. Cl.
*H01L 31/0216* (2014.01)
*H01L 31/0224* (2006.01)
(Continued)

(52) U.S. Cl.
CPC .................. *H01L 31/02161* (2013.01); *H01L 31/022408* (2013.01); *H01L 31/101* (2013.01); *H01L 31/18* (2013.01)

(58) Field of Classification Search
CPC ....... H01L 31/02161; H01L 31/022408; H01L 31/101; H01L 31/18; H01L 31/032;
(Continued)

(56) References Cited

U.S. PATENT DOCUMENTS

| | | | |
|---|---|---|---|
| 2011/0147740 A1* | 6/2011 | Jeong | H01L 29/7869 257/43 |
| 2012/0018719 A1* | 1/2012 | Zan | H01L 51/428 257/43 |

(Continued)

FOREIGN PATENT DOCUMENTS

| | | | | |
|---|---|---|---|---|
| CN | 101086998 A | * | 12/2007 | ......... H01L 27/3269 |
| CN | 104185898 A | * | 12/2014 | ........... H01L 29/045 |

(Continued)

*Primary Examiner* — Sitaramarao S Yechuri
(74) *Attorney, Agent, or Firm* — Polsinelli PC

(57) ABSTRACT

The present disclosure provides a phototransistor and a manufacturing method therefor, the phototransistor having a defective oxide ray absorption layer introduced to an oxide semiconductor phototransistor through a solution process or a defective oxide ray absorption part introduced to an interface between a gate insulation film and an oxide semiconductor layer through interface control, which forms damage, thereby improving light absorption in the range of a visible light region.

6 Claims, 7 Drawing Sheets

(51) Int. Cl.
*H01L 31/101* (2006.01)
*H01L 31/18* (2006.01)

(58) Field of Classification Search
CPC . H01L 31/1136; H01L 27/32; H01L 27/3262;
H01L 29/786; H01L 29/7869; H01L
29/78618; H01L 51/52; H01L 51/5284;
H01L 2924/13056
See application file for complete search history.

(56) References Cited

U.S. PATENT DOCUMENTS

| | | | |
|---|---|---|---|
| 2012/0186642 A1* | 7/2012 | Ballif | H01L 31/056 136/255 |
| 2013/0146131 A1* | 6/2013 | Cuony | H01L 31/0236 136/255 |
| 2014/0252345 A1* | 9/2014 | Tsubuku | H01L 21/02565 257/43 |
| 2020/0295077 A1* | 9/2020 | Huang | H01L 31/101 |

FOREIGN PATENT DOCUMENTS

| | | | | |
|---|---|---|---|---|
| JP | 2015177105 A | * | 10/2015 | ......... H01L 27/3276 |
| KR | 10-0776498 B1 | | 11/2007 | |
| KR | 10-2010-0061359 A | | 6/2010 | |
| KR | 10-2013-0019700 A | | 2/2013 | |
| KR | 10-2015-0072888 A | | 6/2015 | |
| KR | 20150122589 A | * | 11/2015 | ....... H01L 27/14629 |
| KR | 10-1711870 B1 | | 3/2017 | |

* cited by examiner (a) Red light  (b) Green light

OXIDE SEMICONDUCTOR PHOTOTRANSISTOR IMPROVED IN VISIBLE LIGHT ABSORPTION RATE AND MANUFACTURING METHOD THEREOF

CROSS REFERENCE TO RELATED APPLICATIONS

This application is a National Stage of Patent Application No. PCT/KR2018/006727 filed on Jun. 14, 2018, which claims priority from Korean Patent Application No. 10-2017-0154996 filed on Nov. 20, 2017, which are hereby incorporated by reference in their entirety.

BACKGROUND

Field of the Disclosure

The present disclosure relates to an oxide semiconductor photo-transistor with improved visible light absorbance and a method for producing the transistor.

Description of the Background

An oxide semiconductor has recently been attracting attention in a display industry because the oxide semiconductor has low leakage current compared to a silicon semiconductor, and is transparent and a large area process is realized using the oxide semiconductor.

In particular, the oxide semiconductor has various following advantages over an amorphous silicon semiconductor: high mobility, transparency, applicability to a flexible substrate, and a low deposition temperature. Thus, recently, efforts are being made to apply the oxide semiconductor to a photo-transistor.

Especially, the advantage of the very low leakage current among the many advantages of the oxide semiconductor has recently contributed greatly to development of an always-on-display (AOD) function using Variable Refresh Rate (VRR) by which specific information is always displayed even when a screen is turned off. Due to the advantage of the very low leakage current, the oxide semiconductor may have various sensor applications.

FIG. 1 is a cross-sectional view showing a structure of a conventional InGaZnO oxide semiconductor photo-transistor. FIG. 2 shows graphs indicating photo detecting performance when the conventional InGaZnO oxide semiconductor photo-transistor is irradiated with visible light.

The conventional InGaZnO oxide semiconductor photo-transistor 1 has a structure in which a gate electrode 20, a gate insulating layer 30, an InGaZnO oxide semiconductor layer 40, and source/drain electrodes 50 are sequentially stacked on a base substrate 10 as shown in FIG. 1. FIG. 2 shows graphs indicating photo detecting performance when the InGaZnO oxide semiconductor layer 40 of the conventional InGaZnO oxide semiconductor photo-transistor is irradiated with RGB lasers of red light, green light, and blue light.

Usually, the oxide semiconductor has a high bandgap energy above 3 eV. Thus, the conventional oxide semiconductor photo-transistor may operate only in a high-energy ultraviolet region.

That is, when visible light is irradiated to the conventional InGaZnO oxide semiconductor photo-transistor, the conventional InGaZnO oxide semiconductor photo-transistor may absorb only a portion of visible light of a lower wavelength band due to oxygen vacancy defects in sub-gap state of the oxide semiconductor layer.

Therefore, it may be confirmed that when the conventional InGaZnO oxide semiconductor photo-transistor is irradiated with visible light having a wavelength band of 400 nm to 700 nm, the conventional InGaZnO oxide semiconductor photo-transistor reacts with only blue light in a lower wavelength band (405 nm) having a high energy value of 3 eV or higher as shown in (c) in FIG. 2.

To the contrary, the conventional InGaZnO oxide semiconductor photo-transistor exhibits a very slight reaction with green light having an energy value of 2.33 eV lower than that of the blue light and a higher wavelength band of 532 nm, as shown in (b) in FIG. 2. As shown in (a) in FIG. 2, the conventional InGaZnO oxide semiconductor photo-transistor exhibits no substantial reaction with red light having an energy value of 1.95 eV lower than that of the green light and a higher wavelength band of 635 nm.

Thus, photosensitivity of the conventional oxide semiconductor photo-transistor may be improved by adding thereto a separate optical absorption layer composed of various materials such as quantum dots, 2D materials, nanowires, etc. Thus, the photo-transistor that may operate in the visible light region may be fabricated.

Examples of the conventional oxide semiconductor photo-transistor having the separate optical absorption layer added thereto may include a photo-transistor with an organic material (PBDTT-DPP: PCBM) based optical absorption layer added thereto, a photo-transistor with a quantum dot based optical absorption layer added thereto, and a photo-transistor with a silver (Ag) nano-particle based optical absorption layer added thereto.

However, it is difficult to deposit the materials constituting the additional light absorbing layer on a large area substrate at a high uniformity. A production process of the oxide semiconductor photo-transistor having the separate optical absorption layer added thereto is very complex and thus the oxide semiconductor photo-transistor having the separate optical absorption layer added thereto has a relatively high production cost. Further, the separate optical absorption layer may have a low compatibility with the oxide semiconductor layer.

SUMMARY

The present disclosure is intended to solve the above problems. Thus, the present disclosure provides improve visible light absorbance of the conventional oxide semiconductor photo-transistor which may not absorb the visible light because of the high band gap energy.

Further, the present disclosure provides an oxide semiconductor photo-transistor in which uniformity between layers thereof may be achieved while the oxide semiconductor photo-transistor is easily applicable to a large-area display.

Furthermore, the present disclosure provides an oxide semiconductor photo-transistor in which a fabrication process thereof may be greatly simplified to maximize efficiency in the production process thereof while the oxide semiconductor photo-transistor improves the visible light absorbance.

In order to achieve the above, the present disclosure provides an oxide semiconductor photo-transistor and a method for manufacturing the same in which a defective oxide-based optical-absorbing layer or an oxide optical absorption part is provided or defined on or in at least one face of an oxide semiconductor layer made of InGaZnO.

In one aspect, there is provided an oxide semiconductor photo-transistor comprising: a base substrate; a gate electrode disposed on the base substrate; a gate insulating layer disposed on the gate electrode; an oxide semiconductor layer disposed on the gate insulating layer; a source electrode and a drain electrode disposed on the oxide semiconductor layer; and a defective oxide-based optical-absorbing layer disposed on at least one face of the oxide semiconductor layer. In one aspect, the defective oxide-based optical-absorbing layer is disposed on a top face of the oxide semiconductor layer, wherein the defective oxide-based optical-absorbing layer contains oxygen species undercoordinated with residual organic material.

In another aspect, there is provided a method for manufacturing an oxide semiconductor photo-transistor, the method comprising: forming a gate electrode on the base substrate; forming a gate insulating layer on the gate electrode; forming an oxide semiconductor layer on the gate electrode; forming a defective oxide-based optical-absorbing layer on the oxide semiconductor layer; and forming a source electrode and a drain electrode on the defective oxide-based optical-absorbing layer. In one aspect, forming the defective oxide-based optical-absorbing layer includes applying thermal treatment in a range of 150 □ to 400 □ temperature to a solution containing In nitrate ($In(NO_3)_3$) precursor, Ga nitrate ($Ga(NO_3)_3 xH_2O$) precursor, and Zn nitrate ($Zn(NO_3)_2 6H_2O$) precursor to form oxygen species undercoordinated with remaining organic material. In one aspect, the solution has a concentration of 0.1 M to 0.25 M.

In still another aspect, there is provided an oxide semiconductor photo-transistor comprising: a base substrate; a gate electrode disposed on the base substrate; a gate insulating layer disposed on the gate electrode; an oxide semiconductor layer disposed on the gate insulating layer; a source electrode and a drain electrode disposed on the oxide semiconductor layer; and a defective oxide-based optical-absorbing portion defined in at least one face of the oxide semiconductor layer. In one aspect, the defective oxide-based optical-absorbing portion is disposed in a bottom face of the oxide semiconductor layer, wherein the defective oxide-based optical-absorbing layer has roughness imparted thereto.

In still another aspect, there is provided a method for manufacturing an oxide semiconductor photo-transistor, the method comprising: forming a gate electrode on the base substrate; forming a gate insulating layer on the gate electrode; etching an surface of the gate insulating layer to impart roughness thereto; forming an oxide semiconductor layer on the roughness-imparted surface of the gate insulating layer; and forming a source electrode and a drain electrode on the oxide semiconductor layer. In one aspect, forming the oxide semiconductor layer on the roughness-imparted surface of the gate insulating layer is carried out such that the roughness is transferred to a bottom surface of the oxide semiconductor layer to form a defective oxide-based optical-absorbing portion.

According to the present disclosure, a defective oxide thin film, which can absorb visible light may be added as an optical absorbing layer to the oxide semiconductor photo-transistor using a solution process as a relatively simple process. This has effect of increasing the reactivity of the oxide semiconductor photo-transistor with the visible light.

Further, the oxide semiconductor photo-transistor according to the present disclosure may achieve a remarkable uniformity and thus may be easily applied to a large-area display.

In addition, the method for manufacturing the oxide semiconductor photo-transistor according to the present disclosure involves forming sub-gap states in an interface between the oxide semiconductor layer and the gate insulating layer by etching only the gate insulating layer. This may increase the reactivity of the oxide semiconductor photo-transistor with the visible light. Thus, this method may greatly simplify the manufacturing process of the oxide semiconductor photo-transistor, thereby maximizing efficiency in the production process thereof.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTIONS

Figure 1:
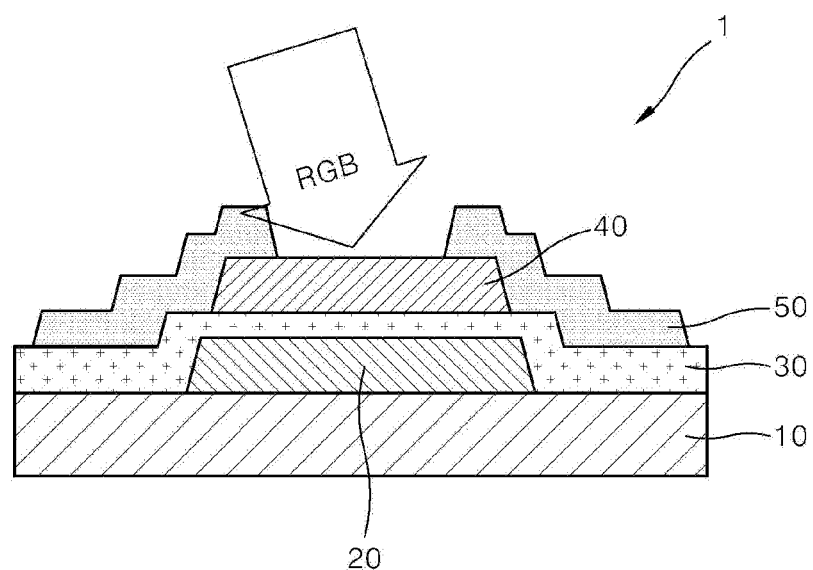
FIG. 1 is a cross-sectional view of a conventional IGZO oxide semiconductor photo-transistor.

Hereinafter, aspects according to the present disclosure will be described in detail with reference to the accompanying drawings. In the drawings, the same reference numerals are used to denote the same or similar elements.

It will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The present disclosure provides an oxide semiconductor photo-transistor having a defective oxide-based optical-absorbing layer or a defective oxide-based optical-absorbing portion and a method for manufacturing the same.

First, in one aspect of the present disclosure, an oxide semiconductor photo-transistor incorporating therein an oxide-based optical absorbing layer formed based on a solution process and a method for manufacturing the same are provided.

Second, in another aspect of the present disclosure, an oxide semiconductor photo-transistor incorporating an optical absorbing layer and a method for manufacturing the same are provided in which interface control such as applying damage to the interface between a gate insulating layer and a oxide semiconductor layer is carried out to improve visible light absorption of the oxide semiconductor photo-transistor.

Figure 3:
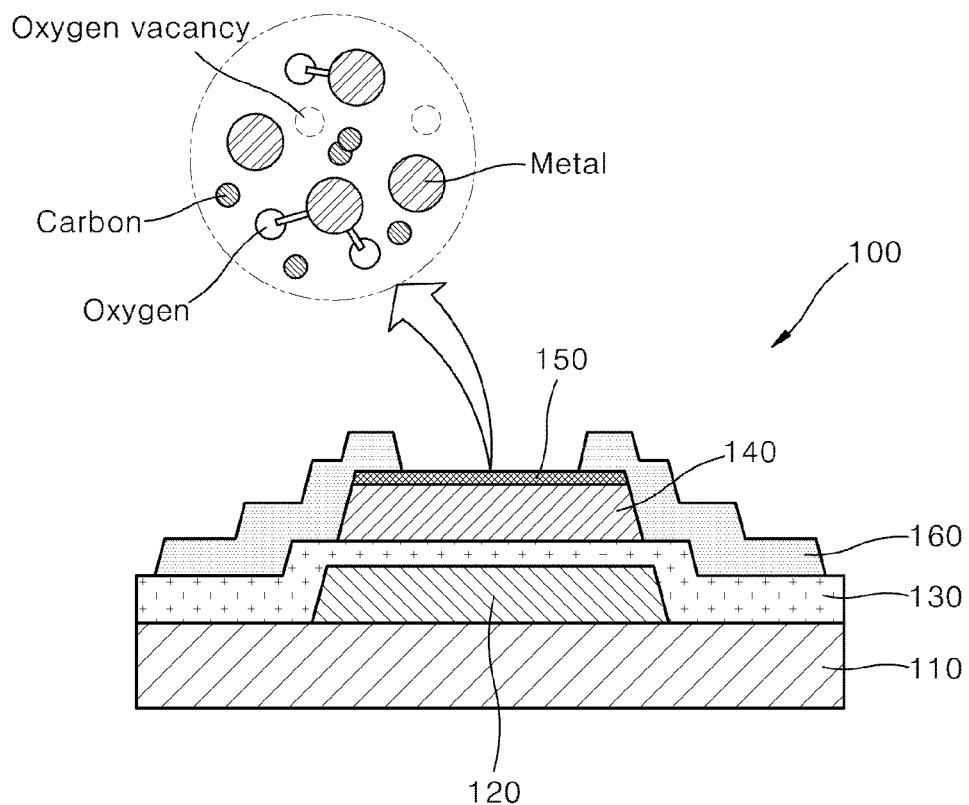
FIG. 3 is an illustration of an IGZO oxide semiconductor photo-transistor and a method for manufacturing the same in accordance with one aspect of the present disclosure.

As shown in FIG. 3, a photo-transistor 100 incorporating an oxide optical absorbing layer formed on the basis of a solution process according to one aspect of the present disclosure includes a base substrate 110, a gate electrode 120 disposed on the base substrate 110, a gate insulating layer 130 disposed on the gate electrode 120, an oxide semiconductor layer 140 disposed on the gate insulating layer 130, a source electrode 160 and a drain electrode 160 disposed on the oxide semiconductor layer 140, and a defective oxide-based optical-absorbing layer 150 disposed on at least one face of the oxide semiconductor layer 140.

Herein, methods for manufacturing the base substrate, the gate electrode, the gate insulating layer, the oxide semiconductor layer and the source electrode and the drain electrode, and a stack structure thereof may be known to those skilled in the art and thus detailed descriptions thereof will be omitted. Rather, main technical features of the present disclosure will be focused on.

The defective oxide-based optical-absorbing layer 150 may be disposed on at least one face of the oxide semiconductor layer. In this connection, it is desirable to form the defective oxide-based optical-absorbing layer on a top face of the oxide semiconductor layer, which may receive visible light directly.

The defective oxide-based optical-absorbing layer 150 may be formed by applying thermal treatment in a range of 150 □ to 400 □ temperature to a solution containing In nitrate ($In(NO_3)_3$) precursor, Ga nitrate ($Ga(NO_3)_3xH_2O$) precursor, and Zn nitrate ($Zn(NO_3)_2 6H_2O$) precursor to form oxygen species undercoordinated with remaining organic material. In this connection, the remaining organic material may be formed because the solvent is not evaporated completely. For example, when 2-methoxyethanol($C_3H_8O_2$) is used as a solvent, 2-methoxyethanol ($C_3H_8O_2$) is decomposed in an annealing process and cannot be evaporated, resulting in the residual organic material. This may be ascertained by measuring absorptivity of C=C bonds and CH bonds using Fourier transform infrared spectroscopy (FT-IR) analysis. The remaining organic material increases the sub-gap states within the bandgap of the oxide semiconductor, thereby allowing light of a long wavelength that conventionally cannot be absorbed using a wide bandgap to be absorbed using the sub-gap states.

According to the present disclosure, the defective oxide-based optical-absorbing layer may be formed to contain oxygen species undercoordinated with the remaining organic material. FIG. 3 shows presence of the remaining organic material including carbons and multiple oxygen vacancies.

In this connection, when the thermal treatment temperature is lower than 150° C., there is generated a considerable amount of remaining organic material in the optical absorbing layer. Thus, the transfer characteristic may not be achieved reliably. Further, when the thermal treatment temperature exceeds 400° C., there is almost no residual organic material left. Thus, the effect of light absorption is greatly reduced.

In addition, the solution including the precursors may have a concentration of 0.1M to 0.25M. When forming the oxide-based optical absorbing layer using a solution having a concentration of lower than 0.1M, a thickness of the optical absorbing layer is greatly reduced and thus an amount of light absorbed per area is reduced. Thus, it is difficult to achieve the effect of light absorption reliably.

In addition, when the oxide optical absorbing layer is formed using a solution having a concentration exceeding 0.25M, a thickness of the optical absorbing layer is too large to interfere with flow of electrons between the source/drain electrodes and channel layer. Thus, there is a disadvantage in that a proper current value may not be achieved due to high current leakage in an on-current region.

Figure 9:
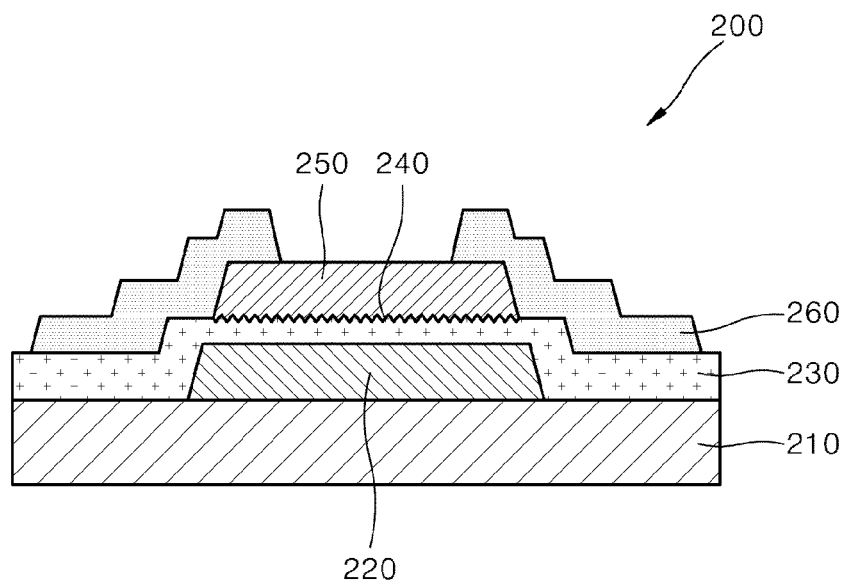
FIG. 9 is an illustration of an IGZO oxide semiconductor photo-transistor according to another aspect of the present disclosure.

Next, in another aspect of the present disclosure, a photo-transistor 200 incorporating an optical absorbing layer therein via an interface control to create a damage to the interface between the gate insulating layer and the oxide semiconductor layer may include, as shown in FIG. 9, a base substrate 210, a gate electrode 220 disposed on the base substrate 210, a gate insulating layer 230 disposed on the gate electrode 220, an oxide semiconductor layer 250 disposed on the gate insulating layer 230, a source electrode 260 and a drain electrode 260 disposed on the oxide semiconductor layer 250, and a defective oxide-based optical-absorbing portion 240 provided on at least one face of the oxide semiconductor layer 250.

Specifically, the defective oxide-based optical-absorbing portion is formed on a bottom face of the oxide semiconductor layer. The defective oxide-based optical-absorbing portion may have roughness.

In this connection, the defective oxide-based optical-absorbing portion on the bottom face of the oxide semiconductor layer may have the roughness by etching a surface of the gate insulating layer to impart roughness to the surface of the gate insulating layer.

That is, when etching the surface of the gate insulating layer, the roughness may be imparted to the surface of the gate insulating layer. Since the oxide semiconductor layer is directly laminated on the roughness-imparted surface of the gate insulating layer, the roughness may be imparted to a bottom face of the oxide semiconductor layer in contact with the surface of the gate insulating layer.

Hereinafter, Aspects and Comparative Examples will be compared with each other using Experimental Examples of the present disclosure.

First Experimental Example

A photo-transistor according to the first Experimental Example of the present disclosure was formed based on an IGZO thin-film transistor. An InGaZnO oxide thin film was sputtered and deposited on p+-Si substrate having a thermal oxide $SiO_2$ grown thereon using a sputtering target with In:Ga:Zn ratio of 1:1:1.

Specifically, the $SiO_2$/p+-Si substrate was subjected to ultrasonic cleaning for 10 minutes using acetone and then to ultrasonic cleaning for 10 minutes methanol and then was subjected to blowing using a nitrogen gun. Thereafter, a thin film of InGaZnO was deposited on the substrate using sputtering for 5 minutes at a working pressure of 5 mTorr under argon (Ar) deposition atmosphere. As a result, an oxide semiconductor layer of InGaZnO having a thickness of approximately 40 nm was manufactured. Thereafter, a thermal treatment process for activation was performed at a temperature above 300 □.

An IGZO thin-film as an oxide optical absorbing layer formed based on the solution process according to the present disclosure was formed as follows. First, a 0.2M InGaZnO oxide solution was prepared using 2-methoxy-ethanol solvent, and using In nitrate ($In(NO_3)_3$) precursor, Ga nitrate ($Ga(NO_3)_3 xH_2O$) precursor, and Zn nitrate ($Zn(NO_3)_2 6H_2O$) precursor where the molar ratio of In:ga:Zn=5:2:1. The prepared solution was deposited on the sputtering-based InGaZnO oxide semiconductor layer as prepared above using spin coating at 3000 rpm for 30 seconds.

The spin-coated solution then underwent a thermal treatment to form a thin film of the optical absorbing layer. In this connection, each thermal treatment was performed at each of the temperatures of 100 □, 200 □, and 300 □. Thus, the undercoordinated oxygen species incompletely coordinated with the residual organic material were formed in the thin film. Thus, the defective oxide-based layer was formed to absorb visible-light.

Finally, in order to deposit the source and drain electrodes, a thickness/length of a channel were limited to 1500 μm/100 μm using a shadow mask and evaporation and then an aluminum (Al) layer having a thickness of 200 nm was deposited.

Figure 4:
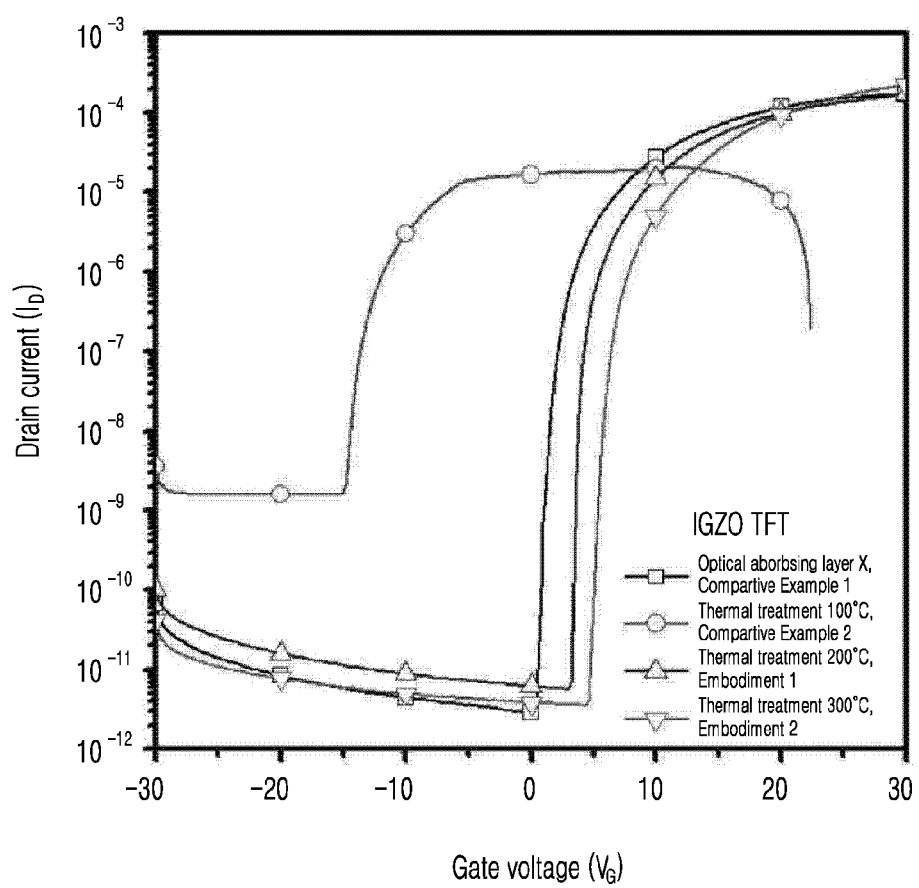
FIG. 4 is a graph showing transfer characteristic change of an InGaZnO photo-transistor based on a thermal treatment temperature, wherein an optical absorbing layer is coated on the InGaZnO photo-transistor via a solution process and is subjected to thermal treatment.

FIG. 4 is a graph showing transfer characteristic change of an InGaZnO photo-transistor based on a thermal treatment temperature, wherein an optical absorbing layer is coated on the InGaZnO photo-transistor via a solution process and is subjected to thermal treatment. First, in Comparative Example 2, when the thin-film forming temperature is 100° C., a considerable amount of the remaining organic material remains in the optical absorbing layer. The transfer characteristic was not be achieved reliably. However, in the first aspect of the present disclosure where the thin-film forming temperature for the optical absorbing layer is 200° C. and in The second aspect of the present disclosure where the thin-film forming temperature for the optical absorbing layer is 300° C., the transfer characteristic similar to that of the InGaZnO phototransistor without the optical absorbing layer may be obtained.

Figure 2:
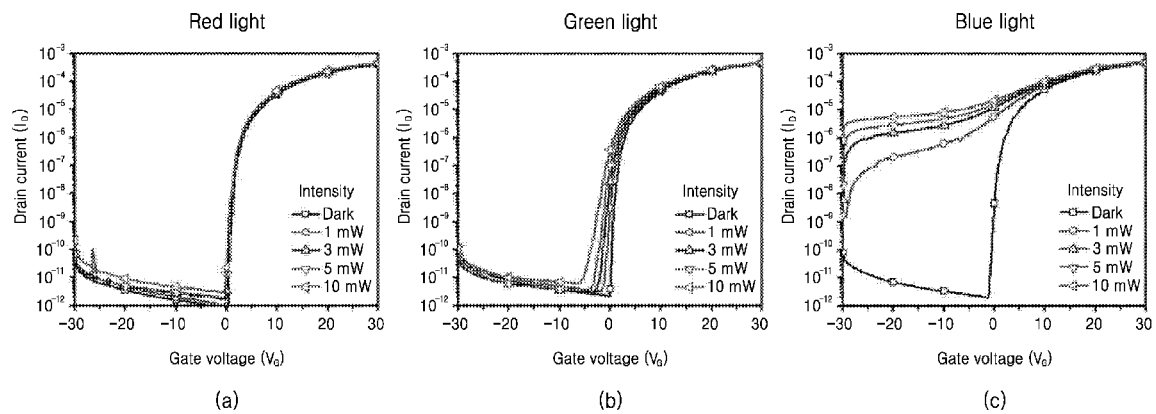
FIGS. 2(a), 2(b) and 2(c) are graphs showing transfer characteristic change of the conventional InGaZnO photo-transistor without an optical absorbing layer when the photo-transistor is subjected to RGB laser irradiation.

FIGS. 2(a), 2(b) and 2(c) as described above are directed to Comparative Example 1. FIGS. 2(a), 2(b) and 2(c) are graphs showing transfer characteristic change of the conventional InGaZnO photo-transistor without an optical absorbing layer when the photo-transistor is subjected to RGB (red, green, blue) laser irradiation. Each transfer characteristic was measured while changing an intensity of the laser to 1 mW, 3 mW, 5 mW, and 10 mW.

As be seen in Comparative Example 1, in the InGaZnO oxide semiconductor photo-transistor without the optical absorbing layer, due to the high bandgap energy of the InGaZnO oxide semiconductor layer, there is almost no change in the transfer characteristic in the laser irradiation of red light and green light. However, in blue light irradiation, an off-current was significantly changed due to formation of ionized oxygen vacancy in the oxide semiconductor layer due to high energy of the blue light laser.

Figure 5:
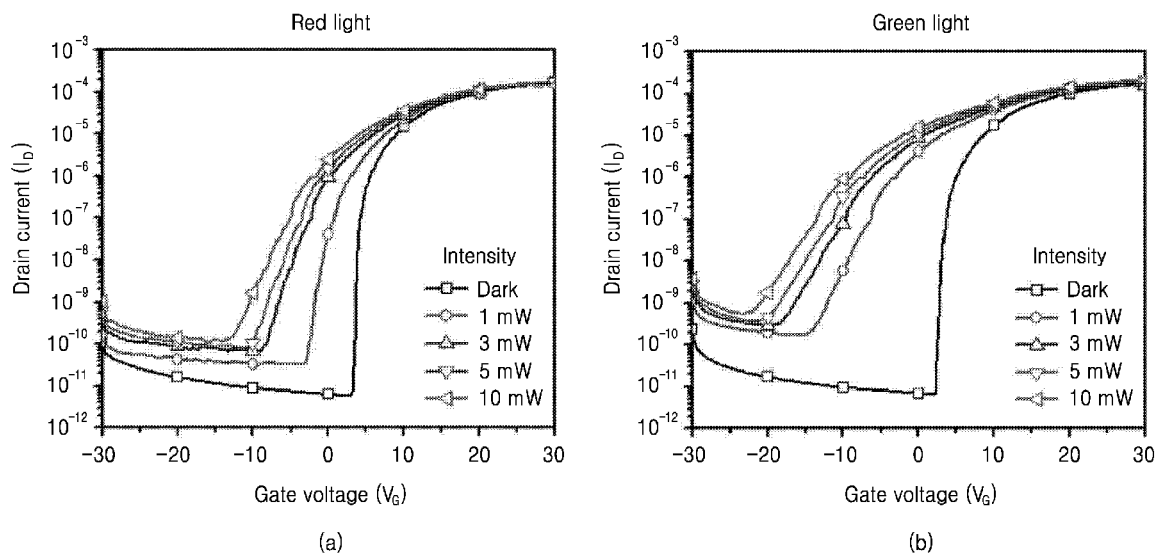
FIGS. 5(a) and 5(b) are graphs showing transfer characteristic change of an InGaZnO photo-transistor when the photo-transistor is subjected to RG laser irradiation, wherein an optical absorbing layer is coated on the InGaZnO photo-transistor via a solution process and is subjected to thermal treatment at 200° C.

FIGS. 5(a) and 5(b) are directed to a first aspect of the present disclosure. FIGS. 5(a) and 5(b) are graphs showing transfer characteristic change of an InGaZnO photo-transistor when the photo-transistor is subjected to RG (red, green) laser irradiation, wherein an optical absorbing layer is coated on the InGaZnO photo-transistor via a solution process and is subjected to thermal treatment at 200° C. As shown in FIGS. 2(a), 2(b) and 2(c), in the blue light laser irradiation, the InGaZnO photo-transistor without the optical absorbing layer was reacted with the blue light. In following Experimental Examples, the transfer characteristic for the blue light was not further tested.

FIG. 5(a) is directed to the irradiation of red light, while FIG. 5(b) is directed to the irradiation of green light. It may be seen that as the intensity of light increases, a threshold voltage shifts in a negative direction and the off current increases. This is because the undercoordinated oxygen species resulting from the combination of the remaining organic material and relatively lower contents of metal and oxygen in the optical absorbing layer absorb red light and green light to generate electrons and holes as carriers and then the carriers move to the oxide semiconductor layer as the channel layer.

Figure 6:
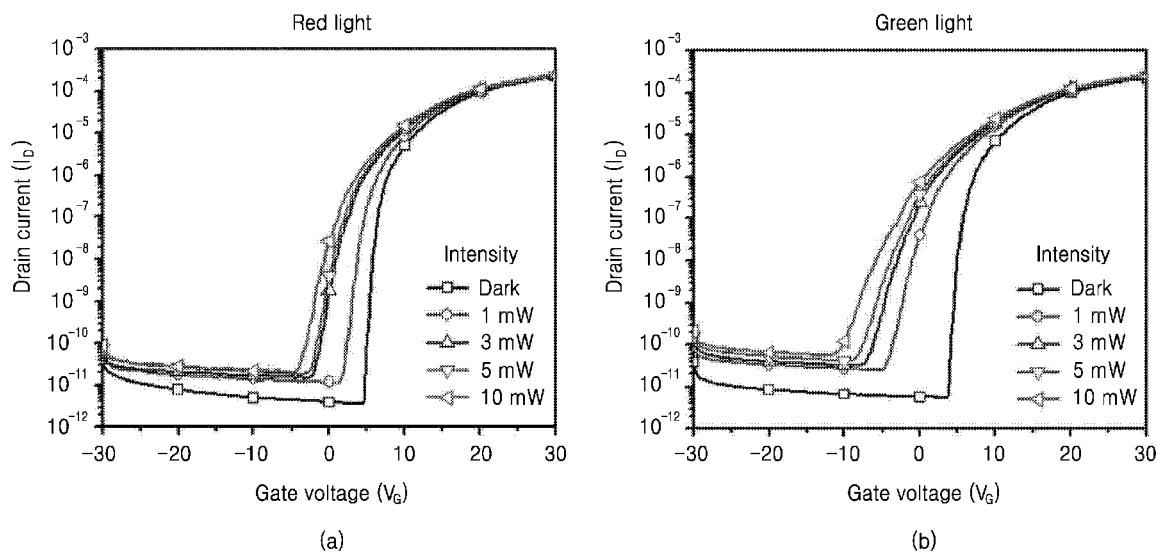
FIGS. 6(a) and 6(b) are graphs showing transfer characteristic change of an InGaZnO photo-transistor when the photo-transistor is subjected to RG laser irradiation, wherein an optical absorbing layer of InGaZnO is coated on the InGaZnO photo-transistor via a solution process and is subjected to thermal treatment at 300° C.

FIGS. 6(a) and 6(b) are directed to a second aspect of the present disclosure. FIGS. 6(a) and 6(b) are graphs showing transfer characteristic change of an InGaZnO photo-transistor when the photo-transistor is subjected to RG laser irradiation, wherein an optical absorbing layer of InGaZnO is coated on the InGaZnO photo-transistor via a solution process and is subjected to thermal treatment at 300° C.

FIG. 6(a) is directed to the irradiation of red light, while FIG. 6(b) is directed to the irradiation of green light. It may be seen in the InGaZnO photo-transistor according to this Aspect that as the intensity of light increases, a threshold voltage shifts in a negative direction and the off current increases. Therefore, it may be confirmed that the InGaZnO photo-transistor has reactivity with red light and green light in comparison with Comparative Example without optical absorbing layer as shown in FIGS. 2(a), 2(b) and 2(c).

Figure 7:
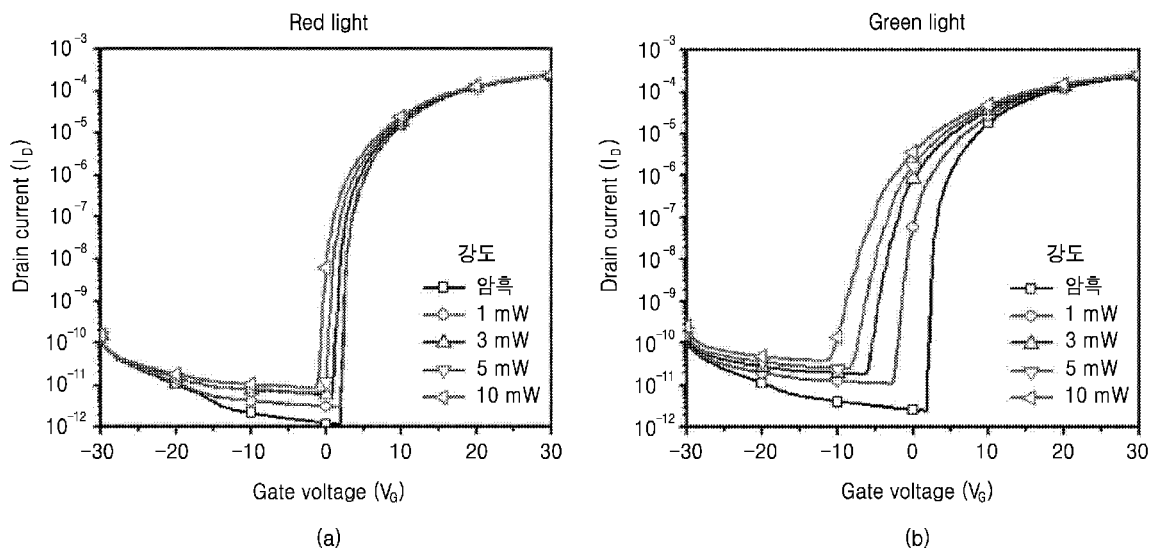
FIGS. 7(a) and 7(b) are graphs showing transfer characteristic change of an InGaZnO photo-transistor when the photo-transistor is subjected to RG laser irradiation, wherein an optical absorbing layer is coated on the InGaZnO photo-transistor via a solution process using 0.1 M.

FIGS. 7(a) and 7(b) are directed to a third aspect of the present disclosure. FIGS. 7(a), 7(b) and 7(c) are graphs showing transfer characteristic change of an InGaZnO photo-transistor when the photo-transistor is subjected to RG laser irradiation, wherein an optical absorbing layer is coated on the InGaZnO photo-transistor via a solution process using 0.1 M. The thermal treatment of the optical absorbing layer was carried out at 200° C. in the same manner as in the first aspect of the disclosure.

FIG. 7(a) is directed to the irradiation of red light, while FIG. 7(b) is directed to the irradiation of green light. It may be seen in the InGaZnO photo-transistor according to this Aspect that as the intensity of light increases, a threshold voltage shifts in a negative direction and the off current increases. Therefore, it may be confirmed that the InGaZnO photo-transistor has reactivity with red light and green light in comparison with Comparative Example without optical absorbing layer as shown in FIGS. 2(a), 2(b) and 2(c).

However, the third aspect of the present disclosure has a threshold voltage shift and an off current change smaller than that of the first aspect of the disclosure which fabricates the optical absorbing layer with a solution of 0.2 M concentration. This is because the optical absorbing layer was fabricated with 0.1M solution and thus a thickness of the optical absorbing layer is reduced such that the amount of light absorbed per area is slightly reduced as compared to the first aspect of the present disclosure where the optical absorbing layer is fabricated with the 0.2M solution.

Figure 8:
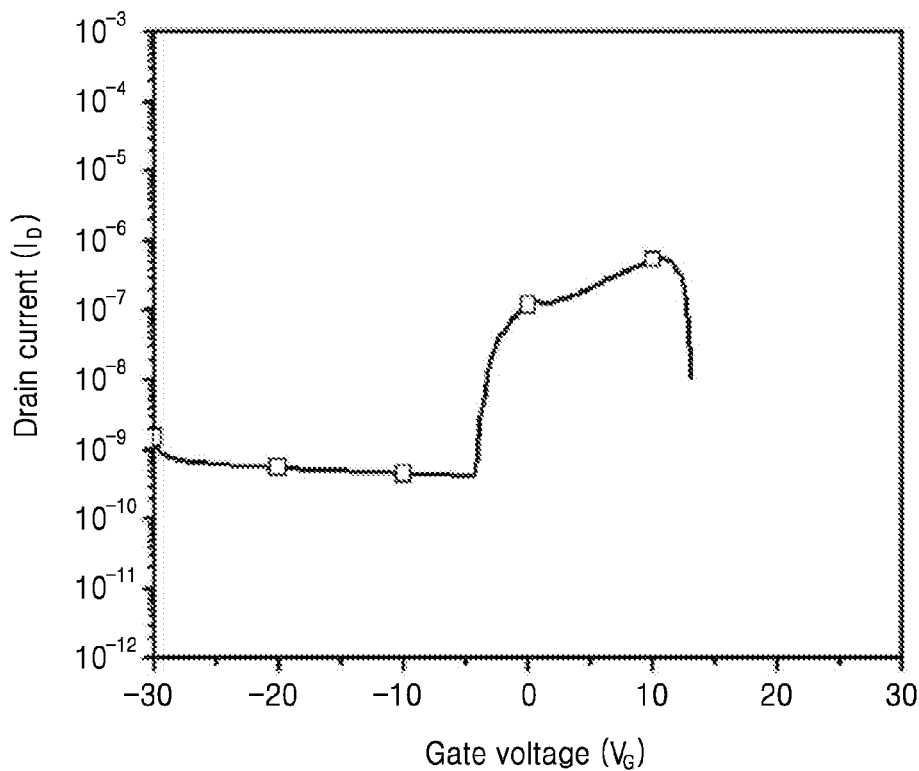
FIG. 8 is a graph showing transfer characteristic change of an InGaZnO photo-transistor when the photo-transistor is subjected to RG laser irradiation, wherein an optical absorbing layer is coated on the InGaZnO photo-transistor via a solution process using 0.3 M.

FIG. 8 is directed to Comparative Example 3. FIG. 8 is a graph showing transfer characteristic change of an InGaZnO photo-transistor when the photo-transistor is subjected to RG laser irradiation, wherein an optical absorbing layer is coated on the InGaZnO photo-transistor via a solution process using 0.3 M. In Comparative Example 3, the thermal treatment of the optical absorbing layer was carried out at 200° C. in the same manner as in the first aspect of the present disclosure.

In the Comparative Example 3, the optical absorbing layer thin film is formed with the 0.3M solution, and, thus, the thickness of the optical absorbing layer is increased by about 10 nm compared to that of the first aspect of the present disclosure using the 0.2 M solution. The optical absorbing layer having the increased thickness is positioned between the source/drain electrode and the channel layer as the semiconductor layer, and thus not only absorbs the light but also interrupts the electron flow. Thus, the current value may not be achieved appropriately due to high current leakage in the on-current region.

Second Experimental Example

A photo-transistor according to the second Experimental Example of the present disclosure was formed based on an IGZO thin-film transistor. In order to fabricate a photo-transistor for detecting the visible-light via the etching of the gate insulating layer, the SiO$_2$ gate insulating layer was etched with BOE (buffered oxide etchant) containing a mixture of hydrofluoric acid (HF) and ammonium fluoride (NH$_4$F).

Specifically, for fabrication of the photo-transistor according to The fourth aspect of the present disclosure, the gate electrode and the gate insulating layer were sequentially thermally grown on a p+ doped silicon (Si) substrate having SiO$_2$ thermally grown thereon.

Next, for the etching of the gate insulating layer, BOE containing a mixture of HF and NH4F in a mixing ratio of 1:7 was used. DI water was added to BOE so that BOE: DI water ratio was 1:10 to control an etching rate. A channel layer of the photo-transistor was fabricated as an IGZO semiconductor layer via a RF sputtering process using a 3-inch target with a molar ratio of In$_2$O$_3$:Ga$_2$O$_3$:ZnO of 1:1:1. The thermal treatment was carried out at a hot plate temperature of 300° C. for 1 hour.

Finally, in order to deposit the source and drain electrodes, aluminum Al was deposited to a thickness of 200 nm via thermal evaporation. In the Comparative Example 4, the photo-transistor was fabricated under the same condition as in the fourth aspect of the present disclosure above except that the gate insulating layer was etched.

Figure 10:
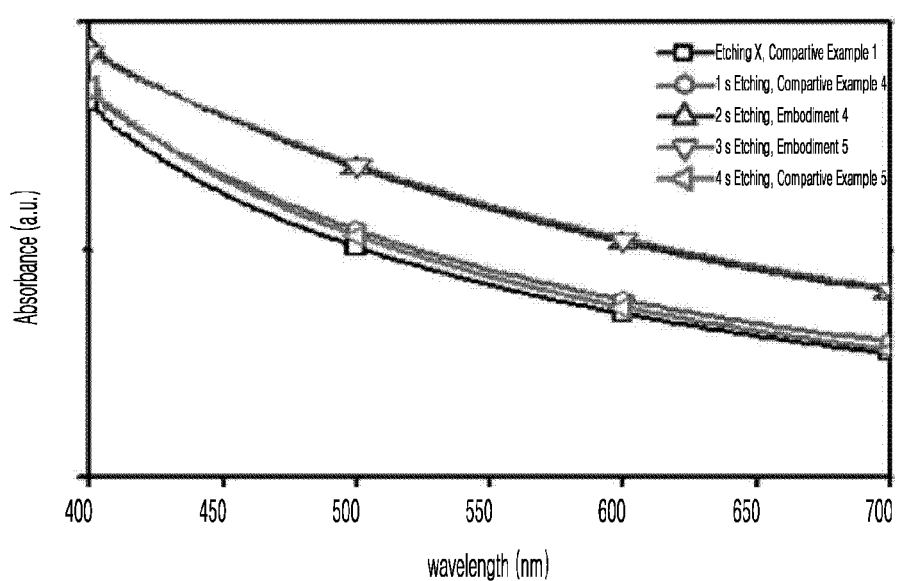
FIG. 10 shows UV-visible analysis based on an etching time of a gate insulating layer.

FIG. 10 shows a result of UV-visible analysis for absorption of visible-light based on the etching time in a case where the gate insulating layer was etched and the oxide semiconductor layer IGZO was deposited on the gate insulating layer. In order to check the change in absorbance in a case when, after the etching of the gate insulating layer, the IGZO semiconductor layer was deposited thereon, the etching of the gate insulating layer was performed for 0 second, 1 second, 2 seconds, 3 seconds, and 4 seconds. In this connection, etchings for 0 seconds, 1 second, 2 seconds, 3 seconds, and 4 seconds correspond to Comparative Example 1, Comparative Example 4, the fourth aspect of the present disclosure, the fifth aspect of the present disclosure, and Comparative Example 5, respectively.

Referring to FIG. 10, in the fifth aspect of the present disclosure where the gate insulating layer was etched for 3 seconds, the visible light absorption by the IGZO layer was the highest. In the fourth aspect of the present disclosure in which the gate insulating layer was etched for 2 seconds, very high visible light absorption was obtained as in the fifth aspect of the present disclosure.

Figure 11:
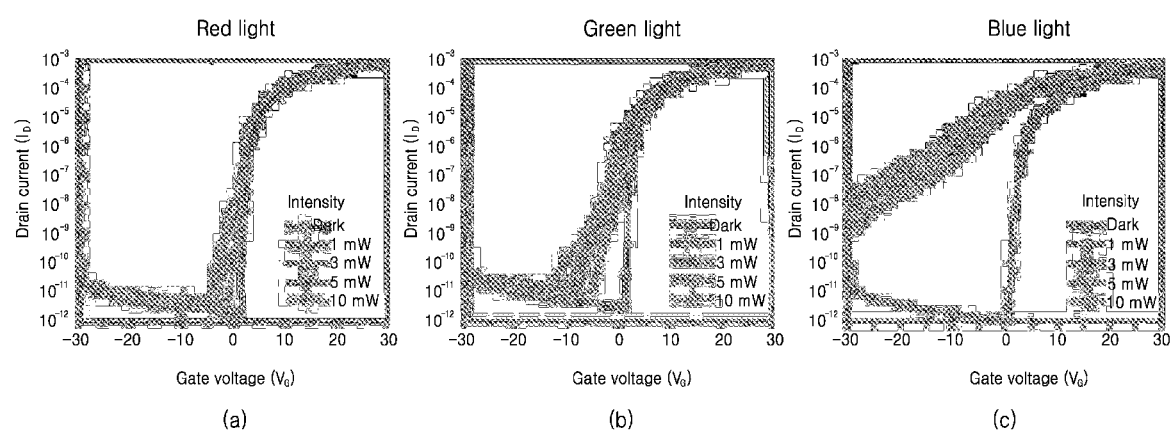
FIGS. 11(a), 11(b) and 11(c) are graphs showing transfer characteristic changes of an InGaZnO photo-transistor according to another aspect of the present disclosure when the photo-transistor is subjected to RGB laser irradiation, wherein in manufacturing the InGaZnO photo-transistor, the gate insulating layer is etched for 3 seconds.

FIGS. 11(a), 11(b) and 11(c) are directed to the fifth aspect of the present disclosure of the present disclosure. FIGS. 11(a), 11(b) and 11(c) are graphs showing transfer characteristic changes of an InGaZnO photo-transistor according to another aspect of the present disclosure when the photo-transistor is subjected to RGB laser irradiation, wherein in manufacturing the InGaZnO photo-transistor, the gate insulating layer is etched for 3 seconds.

As shown in FIG. 11(a), in a transfer curve of the photo-transistor, as the intensity of red light increases, the threshold voltage shifts in the negative direction and the value of the off current increases, compared to Comparative Example 1 as shown in FIG. 2(a) in which as the intensity of the red light increases, the transfer curve of the photo-transistor has no change.

Further, in the green light irradiation shown in FIG. 11(b), as the intensity of the green light increases, the threshold voltage of the photo-transistor moves to the negative direction more greatly and the value of the off current increases. It may be seen that this increase is much larger compared to that of FIG. 2(b) as Comparative Example 1.

Finally, in the blue light irradiation shown in FIG. 11(c), as the intensity of the blue light increases, the threshold voltage of the photo-transistor moves to the negative direction much more greatly and the value of the off current increases more greatly.

As a result, the oxide semiconductor-based photo-transistor fabricated with the etching of the gate insulating layer showed a visible-light detection level higher than that of the oxide semiconductor photo-transistor fabricated without etching the gate insulating layer. It may be confirmed that a degree by which the visible-light detection level improves is large particularly in the red light and green light irradiation.

As described above, conventional studies for fabricating the oxide semiconductor photo-transistor that reacts with a visible light region have been conducted using a scheme for depositing a separate quantum dot or nanowire on an oxide semiconductor layer. However, there are many problems such as the complicated process, human hazard, and aggregation of quantum dots and nanowires in the thermal treatment process, resulting in lower uniformity.

Further, actually, it is very difficult to fabricate and apply the oxide semiconductor photo-transistors using quantum dots or nanowires in a display industry using a large area substrate. In addition, when the organic material as the optical absorbing layer is formed on the oxide semiconductor layer, the layer has a significantly lower reliability than that of an inorganic absorbing layer due to a low compatibility between the organic layer and the oxide semiconductor layer.

According to one aspect of the present disclosure, the defective oxide thin film, which can absorb visible light may be added as an optical absorbing layer to the oxide semiconductor photo-transistor using a solution process as a relatively simple process. This has effect of increasing the reactivity of the oxide semiconductor photo-transistor with the visible light. Further, the oxide semiconductor photo-transistor according to one aspect of the present disclosure may achieve a remarkable uniformity and thus may be easily applied to a large-area display.

In addition, the method for manufacturing the oxide semiconductor photo-transistor according to another aspect of the present disclosure involves forming sub-gap states in an interface between the oxide semiconductor layer and the gate insulating layer by etching only the gate insulating layer. This may increase the reactivity of the oxide semiconductor photo-transistor with the visible light. Thus, this method may greatly simplify the manufacturing process of the oxide semiconductor photo-transistor, thereby maximizing efficiency in the production process thereof.

While the foregoing disclosure has been described with reference to the aspects of the present disclosure, various modifications and variations may be made by those skilled in the art. Accordingly, it is to be understood that such variations and modifications are included within the scope of the present disclosure.

What is claimed is:

1. An oxide semiconductor photo-transistor comprising:
   a base substrate;
   a gate electrode disposed on the base substrate;
   a gate insulating layer disposed on the gate electrode;
   an oxide semiconductor layer disposed on the gate insulating layer;
   a source electrode and a drain electrode disposed on the oxide semiconductor layer; and
   a defective oxide-based optical-absorbing layer disposed on at least one surface of the oxide semiconductor layer,
   wherein the defective oxide-based optical-absorbing layer is disposed on a surface of the oxide semiconductor layer facing the gate insulating layer, and
   wherein the defective oxide-based optical-absorbing layer includes oxygen species undercoordinated with an organic material including carbons.

2. The oxide semiconductor photo-transistor of one of claim 1, wherein the oxide semiconductor layer is made of InGaZnO.

3. An oxide semiconductor photo-transistor comprising:
   a base substrate;
   a gate electrode disposed on the base substrate;
   a gate insulating layer disposed on the gate electrode;
   an oxide semiconductor layer disposed on the gate insulating layer;
   a source electrode and a drain electrode disposed on the oxide semiconductor layer; and
   a defective oxide-based optical-absorbing layer disposed on at least one surface of the oxide semiconductor layer,
   wherein the defective oxide-based optical-absorbing portion is disposed in a surface of the oxide semiconductor layer, facing opposite to the source and the drain electrodes, and
   wherein the defective oxide-based optical-absorbing layer has a roughness portion.

4. A method for manufacturing an oxide semiconductor photo-transistor, the method comprising:
   forming a gate electrode on a base substrate;
   forming a gate insulating layer on the gate electrode;
   forming an oxide semiconductor layer on the gate electrode;
   forming a defective oxide-based optical-absorbing layer on the oxide semiconductor layer; and
   forming a source electrode and a drain electrode on the defective oxide-based optical-absorbing layer,
   wherein the forming the defective oxide-based optical-absorbing layer includes applying thermal treatment in a range of 150° C. to 400° C. temperature to a solution containing In nitrate ($In(NO_3)_3$) precursor, Ga nitrate ($Ga(NO_3)_3xH_2O$) precursor, and Zn nitrate ($Zn(NO_3)_26H_2O$) precursor to form oxygen species undercoordinated with remaining organic material.

5. The method of claim 4, wherein the solution has a concentration of 0.1 M to 0.25 M.

6. The method of claim 4, wherein the oxide semiconductor layer is made of InGaZnO.

* * * * *